(12) United States Patent
Van Haren et al.

(10) Patent No.: US 11,300,887 B2
(45) Date of Patent: Apr. 12, 2022

(54) METHOD TO CHANGE AN ETCH PARAMETER

(71) Applicant: ASML NETHERLANDS B.V., Veldhoven (NL)

(72) Inventors: Richard Johannes Franciscus Van Haren, Waalre (NL); Victor Emanuel Calado, Rotterdam (NL); Leon Paul Van Dijk, Eindhoven (NL); Roy Werkman, Eindhoven (NL); Everhardus Cornelis Mos, Best (NL); Jochem Sebastiaan Wildenberg, Aarle-Rixtel (NL); Marinus Jochemsen, Veldhoven (NL); Bijoy Rajasekharan, Eindhoven (NL); Erik Jensen, Veldhoven (NL); Adam Jan Urbanczyk, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/463,057

(22) PCT Filed: Nov. 6, 2017

(86) PCT No.: PCT/EP2017/078288
§ 371 (c)(1),
(2) Date: May 22, 2019

(87) PCT Pub. No.: WO2018/099690
PCT Pub. Date: Jun. 7, 2018

(65) Prior Publication Data
US 2019/0285992 A1    Sep. 19, 2019

(30) Foreign Application Priority Data

Dec. 2, 2016 (EP) .................................... 16201848
Jul. 18, 2017 (EP) .................................... 17181816

(51) Int. Cl.
*G03F 7/20* (2006.01)

(52) U.S. Cl.
CPC ...... *G03F 7/70525* (2013.01); *G03F 7/70625* (2013.01); *G03F 7/70633* (2013.01); *G03F 7/20* (2013.01)

(58) Field of Classification Search
None
See application file for complete search history.

(56) References Cited

U.S. PATENT DOCUMENTS 5,739,909 A * 4/1998 Blayo .................... G01B 11/02
356/369
6,004,706 A   12/1999 Ausschnitt et al.
(Continued)

FOREIGN PATENT DOCUMENTS

JP   2002208587   7/2002
JP   2005038976   2/2005
(Continued)

OTHER PUBLICATIONS

International Search Report and Written Opinion issued in corresponding PCT Patent Application No. PCT/EP2017/078288, dated Dec. 2, 2018.
(Continued)

*Primary Examiner* — Roberts P Culbert
(74) *Attorney, Agent, or Firm* — Pilisbury Winthrop Shaw Pittman LLP

(57) ABSTRACT

A method to change an etch parameter of a substrate etching process, the method including: making a first measurement of a first metric associated with a structure on a substrate before being etched; making a second measurement of a second metric associated with a structure on a substrate after
(Continued)

being etched; and changing the etch parameter based on a difference between the first measurement and the second measurement.

20 Claims, 7 Drawing Sheets

(56) References Cited

U.S. PATENT DOCUMENTS

| | | | |
|---|---|---|---|
| 6,767,844 | B2 | 7/2004 | Huang |
| 9,207,539 | B1 | 12/2015 | Lam et al. |
| 2004/0063230 | A1 | 4/2004 | Bailey, III et al. |
| 2005/0016682 | A1 | 1/2005 | Nagatomo et al. |
| 2006/0016561 | A1 | 1/2006 | Choi et al. |
| 2008/0079723 | A1* | 4/2008 | Hanson ............... G06K 9/0063 345/427 |
| 2009/0145877 | A1 | 6/2009 | Chang et al. |
| 2012/0008127 | A1 | 1/2012 | Tel et al. |
| 2012/0249986 | A1 | 10/2012 | Tanaka et al. |
| 2015/0045935 | A1 | 2/2015 | Cao et al. |
| 2015/0185625 | A1 | 7/2015 | Chen et al. |
| 2016/0349627 | A1 | 12/2016 | Van Der Schaar et al. |

FOREIGN PATENT DOCUMENTS

| | | |
|---|---|---|
| JP | 2009044075 | 2/2009 |
| JP | 2012204806 | 10/2012 |
| KR | 930003271 | 2/1993 |
| TW | 201011473 | 3/2010 |
| TW | 201531810 | 8/2015 |
| TW | 201535066 | 9/2015 |

OTHER PUBLICATIONS

Taiwanese Office Action issued in corresponding Taiwanese Patent Application No. 106140644, dated Nov. 19, 2018.
Ros, Onintza, et al.: "Effect of etch pattern transfer on local overlay (OVL) margin in 28nm gate integration", Proc. of SPIE, vol. 9054, Mar. 28, 2014.
Matthias, Ruhm, et al.: "Overlay leaves litho: impact of non-litho processes on overlay and compensation", Proc. of SPIE, vol. 9231, Oct. 12, 2014.
Chinese Office Action issued in corresponding Chinese Patent Application No. 2201780074864X, dated Sep. 24, 2020.
Japanese Office Action issued in corresponding Japanese Patent Application No. 2019-529908, dated Oct. 20, 2020.
Korean Office Action issued in corresponding Korean Patent Application No. 10-2019-7018903, dated Dec. 16, 2020.
Japanese Office Action issued in corresponding Japanese Patent Application No. 2019-529908, dated Sep. 7, 2021.
Taiwanese Office Action issued in corresponding Taiwanese Patent Application No. 109130331, dated Jul. 8, 2021.

* cited by examiner

Fig. 7
Before
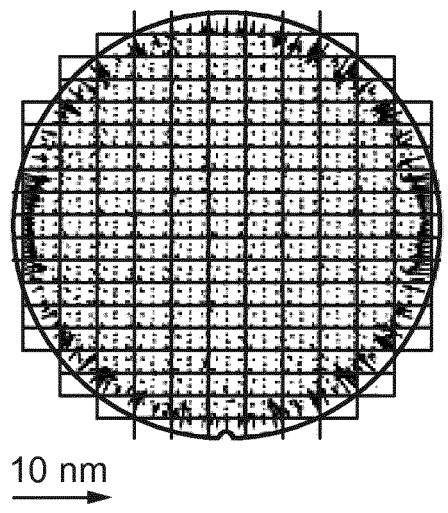
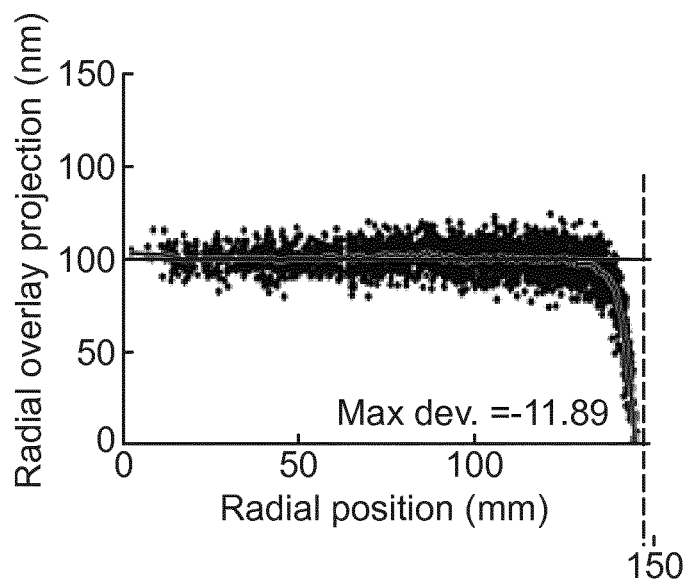
After
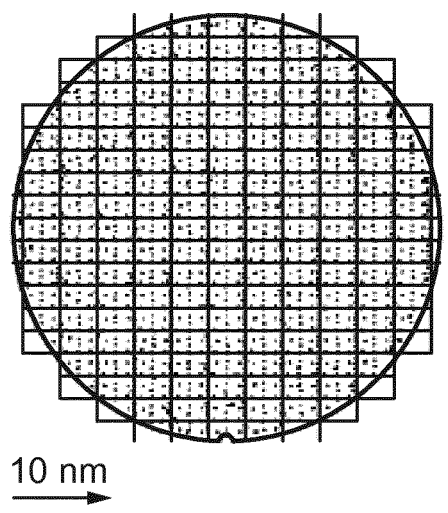
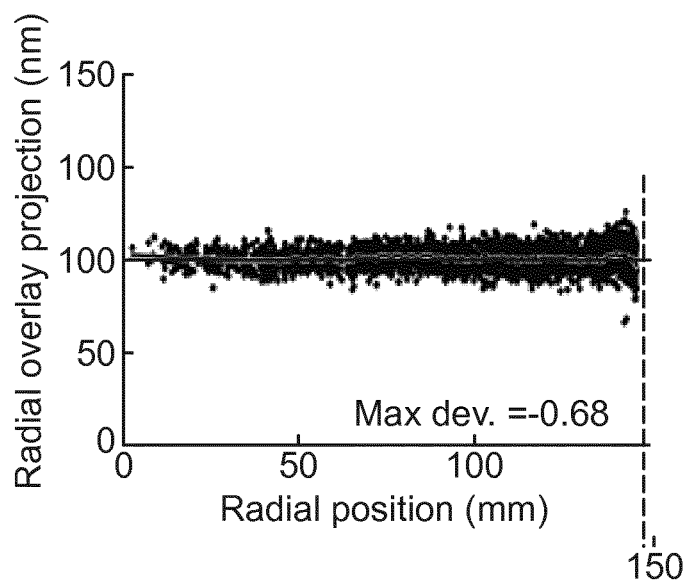

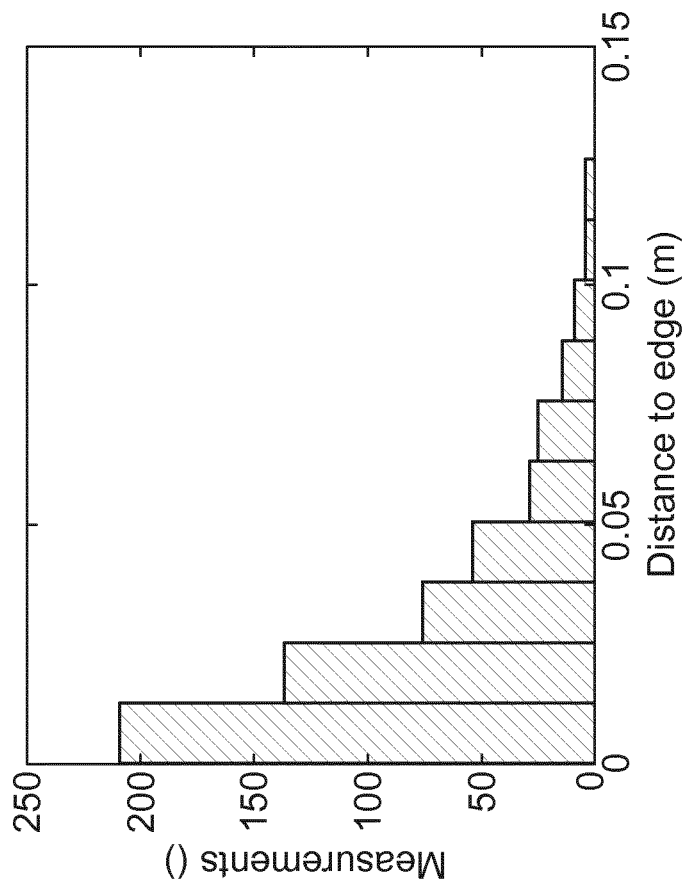
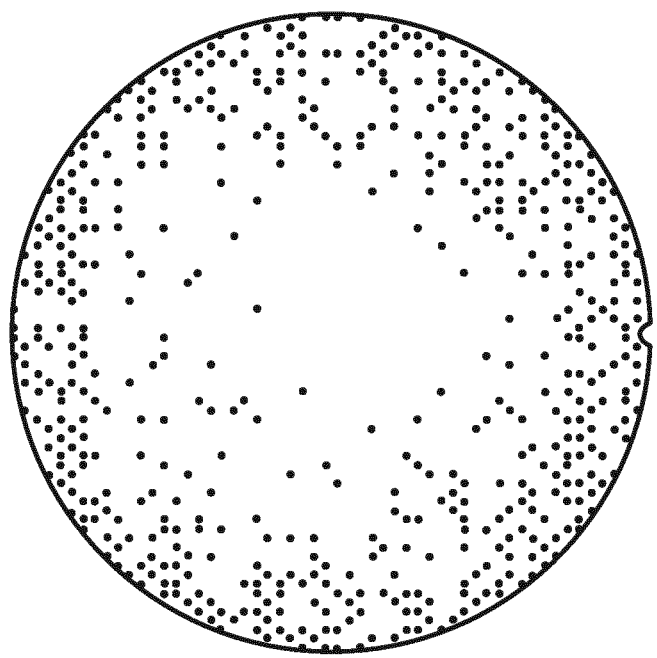
Fig. 8

METHOD TO CHANGE AN ETCH PARAMETER

CROSS-REFERENCE TO RELATED APPLICATIONS

This application is the U.S. national phase entry of PCT patent application no. PCT/EP2017/078288, which was filed on Nov. 6, 2017, which claims the benefit of priority of European patent application no. 16201848.5, which was filed on Dec. 2, 2016, and European patent application no. 17181816.4, which was filed on Jul. 18, 2017, each of which is incorporated herein in its entirety by reference.

BACKGROUND

Field of the Invention

The present invention relates to a method for use in a lithographic process, in particular to a method to change an etch parameter of a substrate etching process. The present invention further relates to computer program products for implementing parts of such a method.

Background Art

A lithographic apparatus is a machine that applies a desired pattern onto a substrate, usually onto a target portion of the substrate. A lithographic apparatus is used, for example, in the manufacture of integrated circuits (ICs). In that instance, a patterning device, which is alternatively referred to as a mask or a reticle, may be used to generate a circuit pattern to be formed on an individual layer of the IC. This pattern is transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

A key performance parameter of the lithographic process is the overlay error. This error, often referred to simply as "overlay", is the error in placing product features in the correct position relative to features formed in previous layers. As device structures become ever smaller, overlay specifications become ever tighter.

Overlay error may be introduced in one or more of several stages of the development of a structure on a substrate. For example, overlay error may be introduced by misalignment of a substrate in a lithographic apparatus during irradiation in the lithographic apparatus. Overlay error can also be introduced in a step subsequent to irradiation, for example in an etching step.

Metrology tools are available to measure overlay error on substrates. Metrology tools which measure overlay error in a non-destructive way, for example metrology tools which are based on diffraction measurements, allow the re-working of a substrate if an overlay error is detected before etching and/or depositing further layers on the substrate.

The etch applied by modern etching apparatus allows one or more etch parameters to be set to control aspects of the etch. Trial and error may be used to set an optimal etch parameter for a given situation.

SUMMARY OF THE INVENTION

The present invention has the aim of reducing etch induced overlay by providing a method to change an etch parameter of a substrate etching process.

According to an aspect of the invention, there is provided a method to change an etch parameter of a substrate etching process, the method comprising: making a first measurement of a first metric associated with a structure on a substrate before being etched; making a second measurement of a second metric associated with a structure on a substrate after being etched; and changing the etch parameter based on a difference between the first measurement and the second measurement, wherein the first metric and second metric are a metric indicative of one or more of: an overlay error between two or more layers on the substrate, an error in the placement of an edge of a feature of one layer of the substrate relative to an edge of a feature of another layer of the substrate, asymmetry in a property of a feature measured at one or more locations on the substrate.

According to an aspect of the invention; there is provided a method of controlling an etch parameter of a substrate etching process, the method comprising: providing a relationship between a first variable indicative of an etch induced effect and the etch parameter; determining an initial value of the etch parameter; performing the substrate etching process on a first set of substrates using the initial value of the etch parameter; and determining the actual first variable on a substrate of the first set of substrates and changing the etch parameter for the substrate etching process for subsequent substrates by an amount predicted by the relationship to result in a desired substrate etching process.

According to an aspect of the invention; there is provided a method of changing an etch parameter of a substrate etching process, the method comprising: making a measurement of an etched structure on a substrate; and changing the etch parameter based on an asymmetry in a result of the measurement.

BRIEF DESCRIPTION OF THE DRAWINGS

Embodiments of the invention will now be described, by way of example only, with reference to the accompanying schematic drawings in which:

FIG. 7 illustrates an associated overlay error in plan and plotted against distance before changing an etch parameter on the left hand side, and the same measurement after changing the etch parameter on the right hand side; and FIG. 8 illustrates a measurement layout and distribution example.

DETAILED DESCRIPTION OF EXEMPLARY EMBODIMENTS

Before describing embodiments of the invention in detail, it is instructive to present an example environment in which embodiments of the present invention may be implemented.

Figure 1:
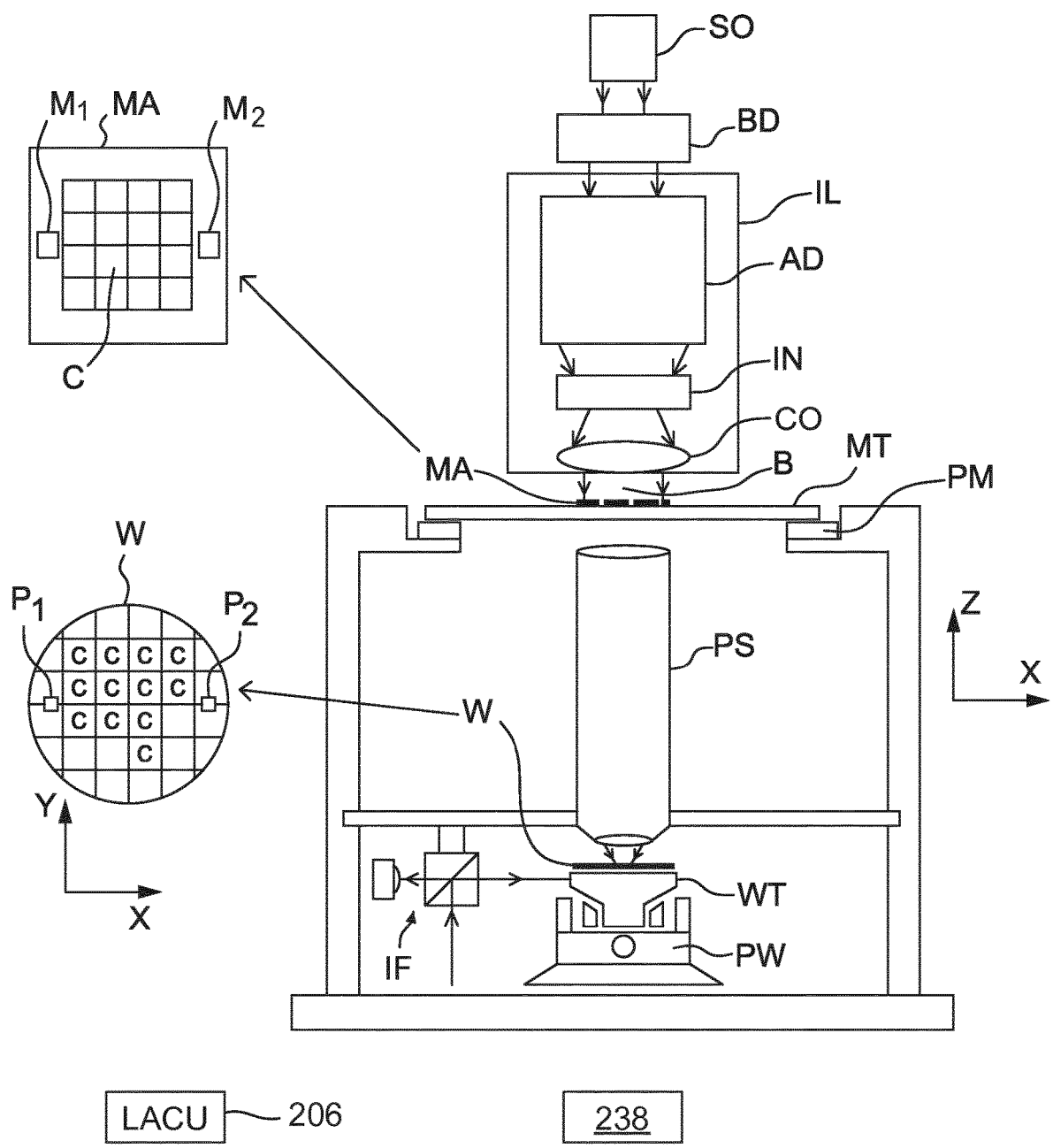
FIG. 1 depicts a lithographic apparatus configured to operate according to an embodiment of the invention.

FIG. 1 schematically depicts a lithographic apparatus LA. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask or reticle) MA and connected to a first positioner PM configured to accurately position the patterning device in accordance with certain parameters;
- a substrate table (e.g. a wafer table) WT constructed to hold a substrate (e.g. a resist coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that may be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device (or a number of devices) being created in the target portion, such as an integrated circuit. The patterning device may be transmissive or reflective. Examples of patterning devices include masks, programmable mirror arrays, and programmable LCD panels.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as G-outer and G-inner, respectively) of the intensity distribution in a pupil plane of the illuminator may be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT is moved accurately, e.g. so as to position different target portions C in the path of the radiation beam B. Similarly, the first positioner PM and another position sensor (which is not explicitly depicted in FIG. 1) is used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (fields), and/or between device areas (dies) within target portions. These are known as scribe-lane alignment marks, because individual product dies will eventually be cut from one another by scribing along these lines. Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C may be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables may be exchanged. While one substrate on one substrate table is being exposed at the exposure station EXP, another substrate is loaded onto the other substrate table at the measurement station MEA so that various preparatory steps may be carried out. The preparatory steps may include mapping the surface height of the substrate using a height sensor LS and measuring the position of alignment marks on the substrate using an alignment sensor AS. The measurement is time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU 206 which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
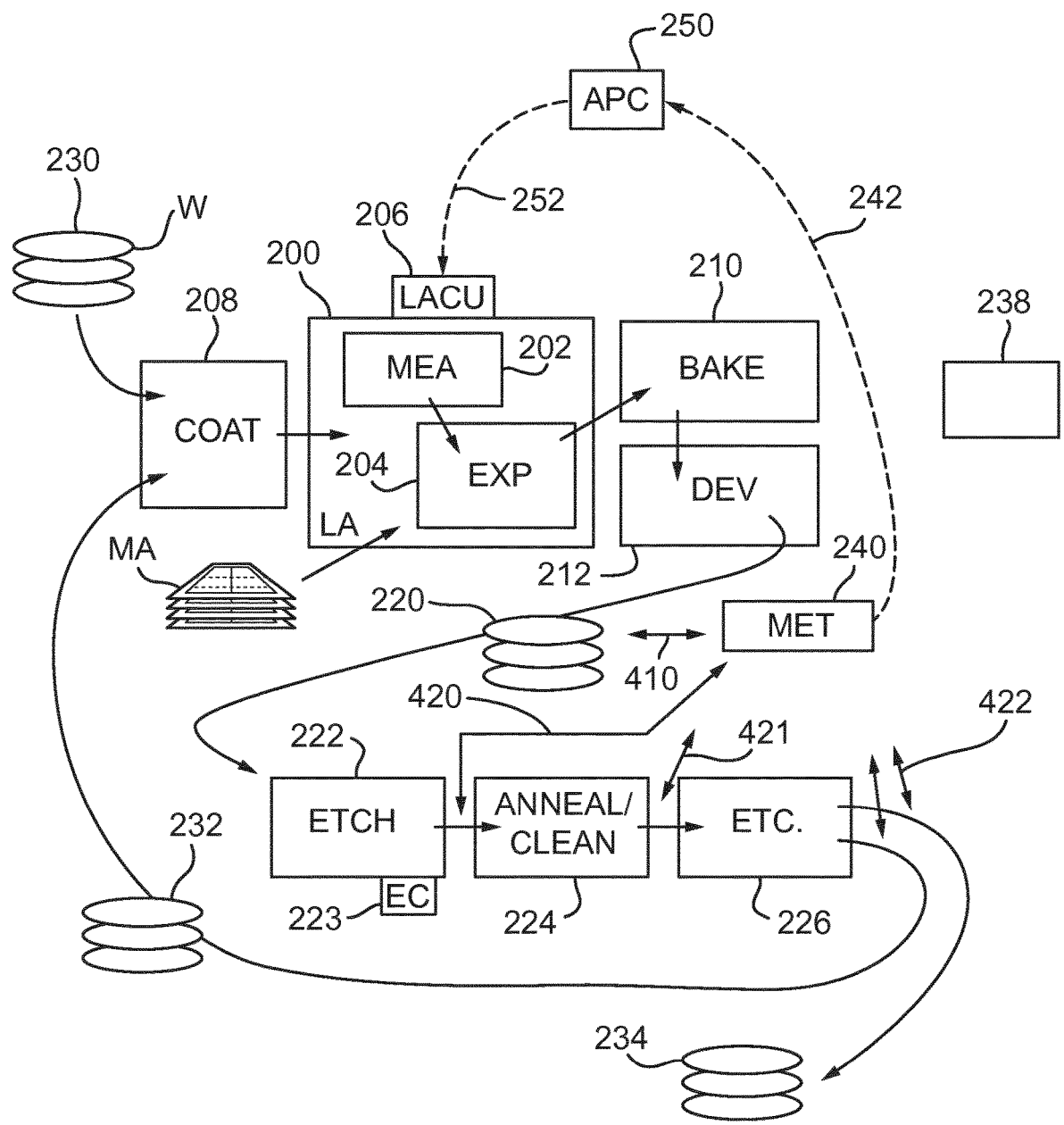
FIG. 2 depicts schematically the use of the lithographic apparatus of FIG. 1 together with other apparatuses forming a production facility for semi-conductor devices.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps is implemented by various apparatuses in a typical manufacturing facility. Apparatus 222 in this embodiment is an etching station, and apparatus 224 performs a post-etch cleaning and/or annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products (substrates 234) to be sent for dicing and packaging.

Each layer of the product structure requires a different set of process steps, and the apparatuses 226 used at each layer may be completely different in type. Moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

The whole facility may be operated under control of a supervisory control system 238, which receives metrology data, design data, process recipes and the like. Supervisory control system 238 issues commands to each of the apparatuses to implement the manufacturing process on one or more batches of substrates.

Also shown in FIG. 2 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 may be used in an advanced process control (APC) system 250 to generate signals 252 to maintain accurate performance of the patterning operations in the litho cluster, by control unit LACU 206 making small adjustments over time, thereby minimizing the risk of products being made out-of-specification, and requiring re-work. Metrology apparatus 240 and/or other metrology apparatuses (not shown) may be applied to measure properties of the processed substrates 232, 234, and incoming substrates 230.

The advanced process control (APC) system 250 may for example be configured to calibrate individual lithographic apparatuses and to allow different apparatuses to be used more interchangeably. Improvements to the apparatuses' focus and overlay (layer-to-layer alignment) uniformity have recently been achieved by the implementation of a stability module, leading to an optimized process window for a given feature size and chip application, enabling the continuation the creation of smaller, more advanced chips. The stability module in one embodiment automatically resets the system to a pre-defined baseline at regular intervals, for example each day. More detail of lithography and metrology methods incorporating the stability module can be found in US2012008127A1. The known example APC system implements three main process control loops. The first loop provides the local control of the lithography apparatus using the stability module and monitor wafers. The second APC loop is for local scanner control on-product (determining focus, dose, and overlay on product wafers).

An etch controller 223 is provided for inputting at least one etch parameter into etching station 222. The at least one etch parameter may be one or more of: a desired thermal pattern across the substrate, a desired chemical concentration pattern in plasma used in the etching process, a desired electric field pattern surrounding a substrate during the etching process, a voltage applied to one more electrodes during the etching process. Each of these etch parameters can be varied so as to vary in a positionally dependent way an etch direction and/or an etch rate and/or another etch factor. By varying at least one of the etch parameters it is possible to optimize the etch process to reduce or eliminate any overlay errors and/or target and/or alignment mark asymmetries introduced in the etching process.

Figure 3:
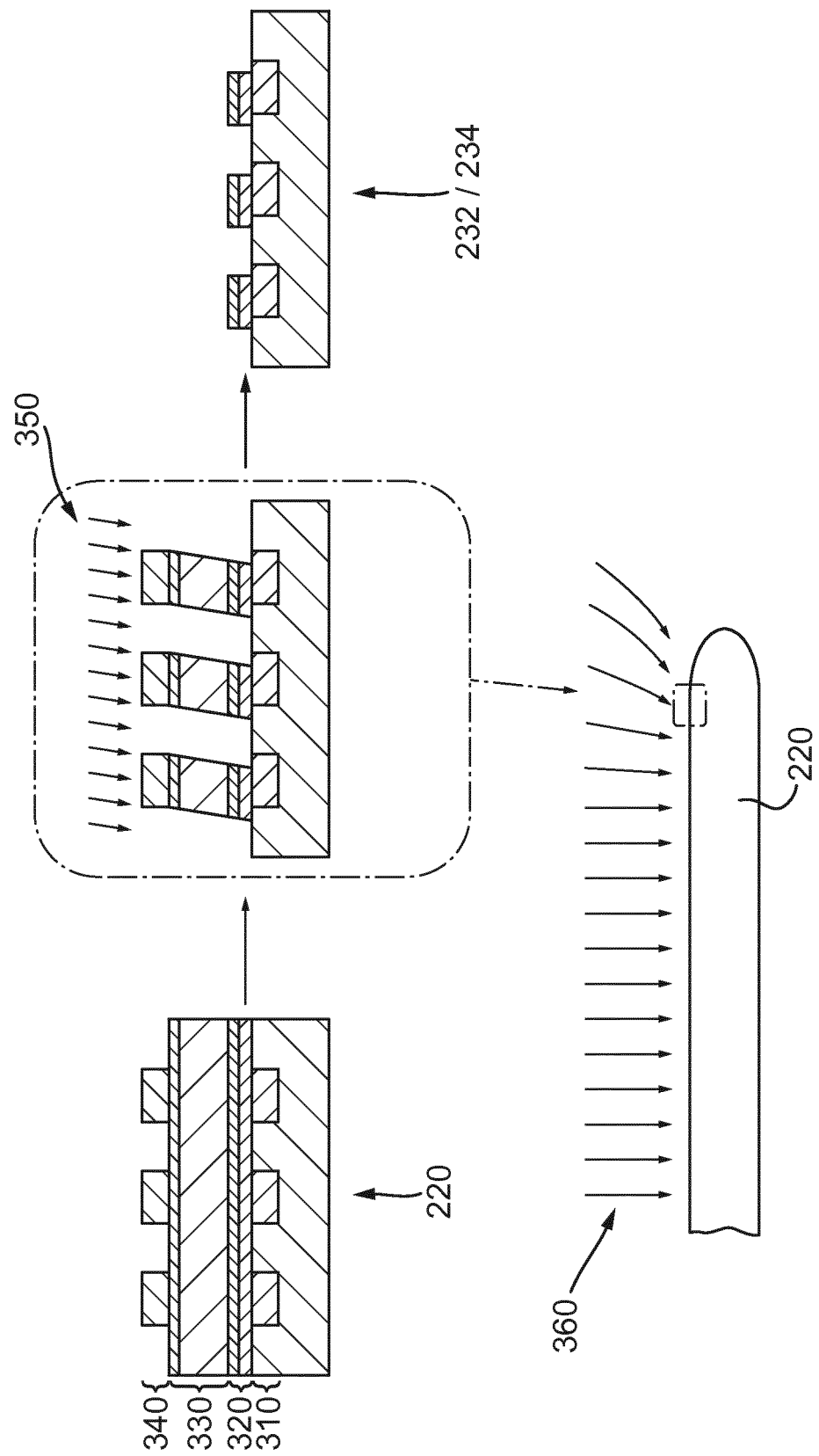
FIG. 3 illustrates schematically a source of etching induced overlay error.

FIG. 3 illustrates how an etching process may introduce overlay errors. FIG. 3 illustrates specifically how overlay errors can be introduced at the edge of a substrate. However, an etch process could introduce overlay errors over the whole of the substrate or in areas other than or in addition to edge areas of the substrate. Overlay errors may be introduced by the etching process in an asymmetrical way.

As illustrated at the top left hand side of FIG. 3, a substrate 220 typically includes a lower layer 310 with a pattern embedded in it. On top of the lower layer 310 one or more device layers 320 are applied. One or more further layers 330 may be applied, before a photoresist layer 340 is applied on which a pattern is irradiated by the apparatus 200 and developed into a physical resist pattern by the developing apparatus 212. As illustrated there is no overlay error between the physical resist pattern and the pattern in the lower layer 310.

In the etching station 222 chemicals, for example a plasma, etch the device layers 320 and any further layers 330 in the gaps in the physical resist pattern of the photoresist layer 340. As illustrated in the top center of FIG. 3, if an etch direction as illustrated by arrows 350 is not perfectly perpendicular to the top surface of the substrate 220 the layers 320, 330 are not etched as rectangles but are etched as parallelograms. The parallelograms correspond positionally at their upper end to the physical resist pattern, but even though there is no overlay error between the physical resist pattern and the pattern in the lower layer 310, the parallelogram does not match up positionally with the pattern of the lower layer 310 at the lower end. Thus, when the layers 330, 340 are removed (by further apparatus 226) to arrive at the final substrate 234 or a substrate 232 for the application of further layers, an overlay error is introduced between the pattern in the lower layer 310 and the pattern etched in the device layers 320, as illustrated in the right hand diagram of FIG. 3.

The overlay illustrated on the right hand side of FIG. 3 is therefore an etching station 222 induced overlay error which would not be present if the etch direction 350 were perfectly perpendicular to the top surface of the substrate 220. The central lower diagram in FIG. 3 illustrates how an imperfect etch direction 350 might be induced. For example at the edge of a substrate 220 an electric field 360 used during the etching process might vary from perfectly perpendicular at the surface of the substrate 220 (which it is at the center of the substrate 220) to being angled relative to the perpendicular direction to the top surface of the substrate 220 at the edge of the substrate 220.

One etch parameter which might be varied to change the direction of the electric field (and so the etch direction 350) is a voltage which can be applied to an electrode surrounding the outer edge of the substrate 220 (see FIG. 5 and related description below). This is an example of an etch parameter which can be varied to vary the etching process (i.e. etch direction 350 at the outer edge of the substrate 220) to reduce overlay error. Similar concepts are disclosed for example in U.S. Pat. No. 6,767,844 which relates to a temperature controlled focus ring surrounding the substrate during etching and US 2006/0016561 which discloses an edge ring member for achieving a uniform etch rate on the entire surface of the substrate.

Other reasons for an etch induced overlay error might include local variations in concentration of chemical etching agent over the surface of the substrate 220 during etching, thermal patterns present in the substrate 220 during etching etc. By varying etch parameters variations over the surface of the substrate 220 in etch direction can be reduced or eliminated. The present invention provides a way for adjusting or changing an etch parameter thereby to reduce etch induced overlay errors.

The invention is aimed to strongly reduce (or even eliminate) the etching contribution in overlay error (asymmetry and/or displacement) by optimizing at least one etch parameter on the etching station 222. The idea is to use a map of a difference between measurements (e.g. overlay) before and after etching the substrate 220 for this purpose. This map is free from any lithographic apparatus 200 and mask MA overlay error contribution and only contains contributions from the etching station 222. Depending on the correction capabilities of the etching station 220, the differences in the map are reduced and/or minimized or (if possible) reduced to zero. As a consequence, both the target asymmetry as well as the induced shift across the substrate 220 can be eliminated resulting in an improved edge placement error performance.

In the present invention, developed substrates 220 pass to metrology apparatus 240 (path 410) before moving to the etching station 222. A first measurement is made using the metrology apparatus 240 of a first metric associated with a structure on the substrate 220 before being etched. The first metric may be indicative of one or more of: an overlay error between two or more layers on the substrate (for example between the pattern in lower layer 310 and the physical resist pattern 340), an error in the placement of an edge of a feature of one layer of the substrate 220 (for example an edge of a feature in the pattern in lower layer 310) relative to an edge of a feature of another layer (for example a feature in the physical resist pattern 340), a difference between a desired dimension of a feature and a measured dimension of a feature (e.g. critical dimension (CD)) or a asymmetry in a property measured at one or more locations on the substrate 220.

Only a single measurement of a first metric may be made or multiple measurements of a first metric at different locations on the substrate 220 may be made. In an embodiment multiple measurements at the same location on the substrate 220 may be made. In an embodiment the first metric is a statistic relating to a plurality of individual measurements. A statistic could be one or more of a fit of the first metric to a model of the first metric, an average of the plurality of individual measurements, a standard deviation of the plurality of individual measurements, a mathematical function fitted to the plurality of individual measurements. First measurements may be made of the first metric on multiple structures on the substrate 220.

In an embodiment, the metrology results 242 from the metrology apparatus 240 may be used in the advanced process control (APC) system 250 as described above or the products may be diverted for re-working if the metrology results 242 indicate that to be desirable. Otherwise the substrate 220 passes to the etching station 222 where the substrate 220 is etched under the control of the etch controller 223. After the substrate has been etched (either immediately after leaving the etching station 222 (path 420), or after leaving the post-etch cleaning and/or annealing station 224 (path 421) or after further downstream processing apparatus 226 (path 422)) the etched substrate 232/234 again passes to the metrology apparatus 240.

A second measurement of a second metric associated with a structure on the substrate 232/234 after being etched is then made. In an embodiment the second measurement is the same type of measurement as the first measurement. In an embodiment the second metric is the same type of metric as the first metric. In an embodiment the structure on which the second measurement is made is the same as the structure on which the first measurement is made. In an alternative embodiment the structure on which the second measurement made is a different structure to that on which the first measurement is made. In the case that the second measurement is made on a different structure to that on which the first measurement is made, it may be necessary to fit a function to the measurements prior to subtracting the first measurement from the second measurement as the location on the substrate of the first and second measurements will not be exactly the same. It may additionally or alternatively be desirable, even if the first measurement and the second measurement are made on the same structure, to map the first and second measurement locations to a common grid (because the rotational alignment of the substrate may be different when it is placed in the metrology apparatus 240 for the first measurement to when it is placed in the metrology apparatus 240 for the second measurement).

In an embodiment the first measurement is a measurement indicative of the overlay error between the pattern in the lower layer 310 and the physical resist pattern 340. The second measurement is a measurement of the overlay error between the pattern in the lower layer 310 and the pattern in the device layers 320. The measurements may either be made on the same features of the pattern in the lower layer 310 for both the first and second measurements or may be made on different features of the pattern in the lower layer 310.

In an embodiment the features in both the lower layer 310, in the physical resist pattern 340 and in the pattern in the device layers 320 are patterns of a specifically designed target portion for the measurement of overlay error (or a different metric). In an embodiment the features in both the lower layer 310, in the physical resist pattern 340 and in the pattern in the device layers 320 used in the first and second measurements are gratings.

Preferably the first and second measurements are made on the same substrate so account does not need to be taken of substrate to substrate variation in overlay error. However this need not be the case and if overlay error resulting from processes upstream of the etch is small compared to the overlay error resulting from the etch, the first and second measurements can be made on different substrates. This may be particularly suitable for coarse improvements in the at least one etch parameter. This has the advantage of increasing throughput as a substrate behind the substrate on which the first measurements are made is not held up before being etched whilst the second measurement is made on the first substrate. If the first and second measurements are made on different substrates, it may be desirable to include further steps to determine whether the difference between the first and second measurements is the result of substrate to substrate variation or whether it can be ascribed to the effect of the etching process in the etching station 220.

The results of the second measurement will include the effect of the steps applied to the substrate 220 before it is first passed to the metrology station 240 (i.e. as measured in the first measurement) as well as any changes to that metric introduced by the etching process in the etching station 220 (and any further downstream steps in apparatus 224, 226 through which the substrate may pass before passing back to the metrology apparatus 240 as described above). A difference between the first measurement and the second measurement is therefore indicative of the effect of the processes applied to the substrate between the first and second measurement, in particular indicative of the effect on the metric of the etching process in the etching station 220.

Figure 4:
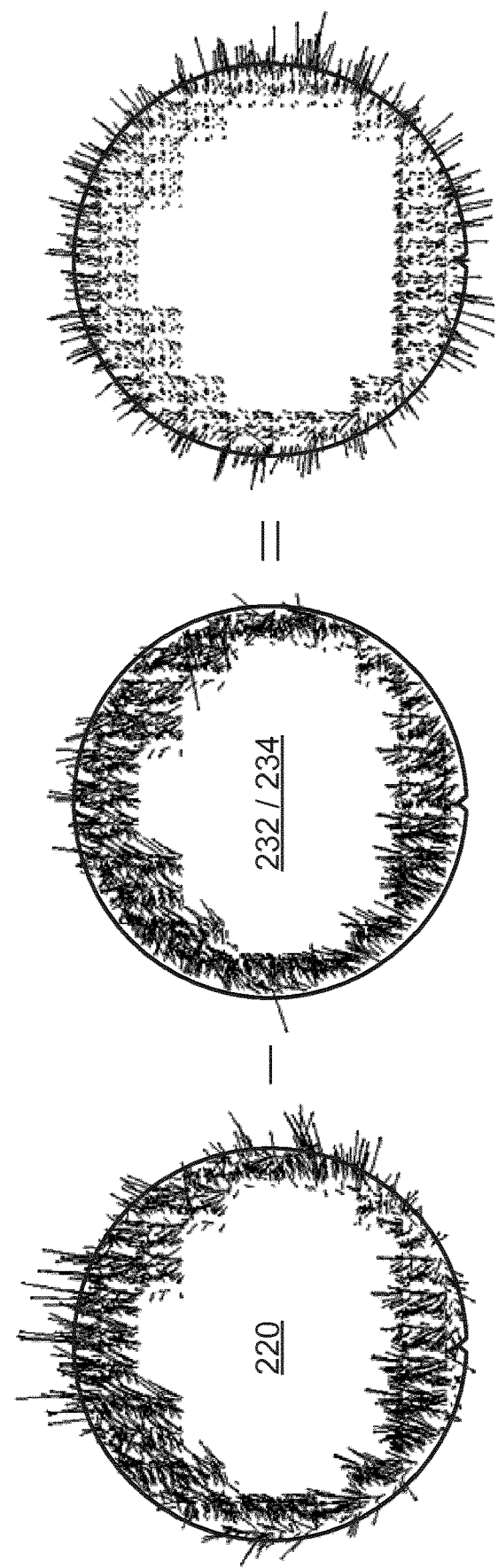
FIG. 4 illustrates on the right hand side a difference between a first measurement made before etching (left hand side) and a second measurement made after etching (center)

An embodiment is illustrated in FIG. 4 in which a first measurement indicative of overlay error is made on a substrate 220 after leaving the developing apparatus 212 (left hand most results in FIG. 4). The length of the lines is indicative of the overlay error at that location on the substrate 220. A second measurement is then made to the substrate 232, 234 after the substrate 220 is etched in the etching station 222 (central results in FIG. 4). By taking away the first measurement from the second measurement, the results on the right hand side of FIG. 4 are achieved. These results show the effect on overlay error of the processes carried out on the substrate 220 after leaving the development apparatus 212 and before arriving at the metrology apparatus 240 for the second time (i.e. after being etched).

Based on the difference between the first measurement and the second measurement at least one etch parameter used by the etch control 223 may be varied for performing an etch on a subsequent substrate 220. This is achieved by the metrology apparatus 240 passing the results of the first measurement and second measurement (alternatively or additionally just the difference between the first measurement and the second measurement or instructions of how to vary at least one etch parameter) to the etch controller 223 via signals. The signals from the metrology apparatus 240 to the etch controller 223 may be routed directly or indirectly, via the APC 250 and/or via supervisory control system 238.

The above described methodology uses a metrology apparatus 240 which is non-destructive for making the first measurement and second measurement. Preferably the whole process is carried out automatically, for example under control of supervisory control system 238. The first and second measurements may be made on only the first substrate of a lot of substrates (in the interests of high throughput) or may be performed more or less frequently. In an embodiment the frequency of the first and second measurements being made depends upon the difference between the latest first and second measurements and whether or not the difference is below a predetermined maximum desirable difference.

This technique can be applied to keep the difference between the first measurement and second measurement to a minimum over time by dynamically adjusting the available etch parameters thereby mitigating the effects of drift and/or wear of components of the etching station 222.

The difference between the first and second measurements on which the change in etch parameter is based may be one or more of a magnitude of difference between the first and second measurements, an asymmetry between the first and second measurements, a location of a difference between the first and second measurements.

The first measurement and the second measurement may be a diffraction based overlay measurement. The results of the diffraction based overlay measurements may be calibrated based on SEM analysis of cross-sections of the substrate from which diffraction based overlay measurements are taken.

In an embodiment the metrology apparatus makes the first measurement and second measurement by measuring first and/or higher order diffraction patterns of incident radiation. For this purpose a substrate may be provided with one or more test gratings at which measurements of the first and second metric may be made by the metrology apparatus. The first measurement and second measurement may be performed using the same or different wavelengths of radiation and/or the same or different polarization states. Changing the wavelength and/or polarization state may enable different types of metric to be measured, for example asymmetry may be measurable at a first wavelength and/or polarization but not at a second wavelength and/or polarization. In the case of zero overlay it would be expected that the difference between the first and second measurement would tend towards zero for every wavelength and every polarization state.

In the above described method the first and second measurements are non-destructive. This is preferable as the process may be completely automated and does not require destruction of the substrate. However, some types of defect introduced by the etch process in the etching station 220 may not be detectable in a non-destructive way. For example edge placement error may be best determined by dimensional and/or geometrical measurements of a cross-section of the respective substrate. In that case it may be necessary to take a cross-section of a substrate and view it under a microscope, for example a scanning electron microscope, in order to make the dimensional and/or geometrical measurements.

In the example of FIG. 4, it can be seen that the difference between the first measurement (left hand side) and second measurement (central) as shown on the right hand side of FIG. 4 is an increased difference in the overlay error measured at the edge of the substrate. This could be the result of the type of etching induced overlay error explained with reference to FIG. 3. One way of reducing this difference might be, for example, to change the etch parameter indicative of a voltage applied to an electrode positioned around an edge of the substrate W during the etching process in the etching station 220.

The way in which the etch parameter is changed based on the difference between the first measurement and the second measurement can be determined in any way. For example, rules relating to the observed difference between the first and second measurements and which etch parameter and/or how to change the etch parameter may be determined experimentally by repeating first and second measurements on a plurality of substrates and varying etch parameters and observing the change in difference between the first and second measurements. Additionally or alternatively the rules may be one or more theoretically based rules.

The method may vary one or more etch parameters and the rules for varying the etch parameter may include rules for which etch parameter to vary dependent upon the observed difference between the first measurement and the second measurement, for example in terms of the magnitude or position of differences or measured asymmetry. The first metric and second metric may be statistically based, for example relating to a plurality of individual measurements.

As an alternative to basing the etch parameter variation on the difference between the first and the second measurement exclusive use of after-etch measurements associated with a property of any suitable structure may be used. For example a grating structure is formed in a layer of resist on a substrate after exposure using a lithographic apparatus and development of the resist. After a subsequent etching step using an etcher a grating structure is formed in one or more layers on the substrate. Measurements performed on the etched grating structure may reveal whether the etching parameters associated with the etching step are correct, or need adaptation. For example an electric field 360 used during the etching process might vary from perfectly perpendicular at the surface of the substrate 220 (which it is at the center of the substrate 220) to being angled relative to the perpendicular direction to the top surface of the substrate 220 at the edge of the substrate 220. This may cause the formation of a non-rectangular shaped etched grating structure; basically the sides of elements forming the grating (see FIG. 3) may be non-perpendicular to the top surface of the substrate. This will cause (as explained before) an error in the overlay between features within different layers on the substrate. A measurement representative of the asymmetry of the etched grating structure may be used to change one or more parameters of the etching step. The asymmetry in this case is associated with a deviation of a etched structure from a rectangular shape. For example a measurement of a geometry of a cross-section of an etched grating structure may reveal the direction of the (plasma) etching at the edge of the substrate, which is indicative of the direction of the electric field 360. Alternatively measuring first and/or higher order diffraction patterns of radiation incident on the etched grating structure may be used to determine the asymmetry (a method referred to as scatterometry). Typically asymmetry of an etched structure will cause an asymmetry in intensity between diffraction orders (for example between the first and the minus first order) of radiation diffracted from the etched structure. However the utilized measurement method is not limited to determination of a diffraction pattern and/or a geometry of a cross-section, any suitable measurement method and/or result of the measurement method may be used which is suitable for reconstruction of a measure of asymmetry associated with the etched structure. The etched structure is typically a grating structure, but may be any suitable structure, for example any of: an isolated line, an isolated contact, a two-dimensional array of structures, a product structure.

The measurement may not be limited to only one etched structure, but may include measurements performed at multiple locations on the substrate and/or multiple types of etched structures (for example etched grating structures with different pitches). This may improve the accuracy of controlling the etch apparatus; the determined change of the etch parameter will be more representative for the substrate of interest and/or structures of interest.

In an embodiment a method of changing an etch parameter of a substrate etching process is disclosed, the method comprising: making a measurement of an etched structure on a substrate; and changing the etch parameter based on an asymmetry in a result of the measurement.

In a further embodiment the measurement is based on scatterometry.

FIGS. 5-8 and the related description below explain one way in which rules may be used to change the etch parameter. Indeed the method described in relation to FIGS. 5-8 may be used in combination with the method described above which takes a first measurement and a second measurement, or may be applied in a method to change an etch parameter which requires a measurement step which may be different to that described above. In any case, the rules may relate to a predetermined relationship between the difference and the etch parameter as described above. In an embodiment the rules relate to a trend in a variation of a first variable associated with an etch induced effect with a variation in the etch parameter as described below.

As illustrated in FIG. 4, in order to increase throughput it may be desirable to make the first and second measurements predominantly or exclusively around an edge portion of the substrate, e.g. at a location where etch induced overlay errors are expected to be observed.

In an embodiment, the etch parameter is only changed if the difference between the first measurement and the second measurement is greater than a pre-determined minimum difference.

The above described process may be repeated as often as desired. In an embodiment the process is repeated until the difference between the first measurement and the second measurement tends towards a pre-determined level (close to zero). The process may then only be repeated at pre-determined intervals (e.g. time based, or number of substrates based) dependent upon the (expected) stability of the etching station 220, to ensure stable etching station 222 performance. The pre-determined interval may vary dependent upon the last measured difference between the first measurement and second measurement. Alternatively or additionally the pre-determined interval may be reduced based on a statistical method, for example based on a trend over time of the difference between the first measurement and second measurement. In an additional or alternative embodiment the pre-determined interval is based on a completely different measurement such as a direct or indirect measurement of the drift of the etching station. In this way deterioration of components in the etching station 220 can be monitored and steps taken to compensate for the deterioration of a component or to alert an operator that the component needs replacing. One such component is a voltage ring surrounding the outer edge of the substrate which has a limited lifetime.

The method can be used to optimize more than one etch parameter. For example the nature of the difference between the first measurement and second measurement may be used to indicate that a certain etch parameter of a plurality of etch parameters should be changed whilst the remaining etch parameters should be left unchanged or changed by a different amount.

Figure 5:
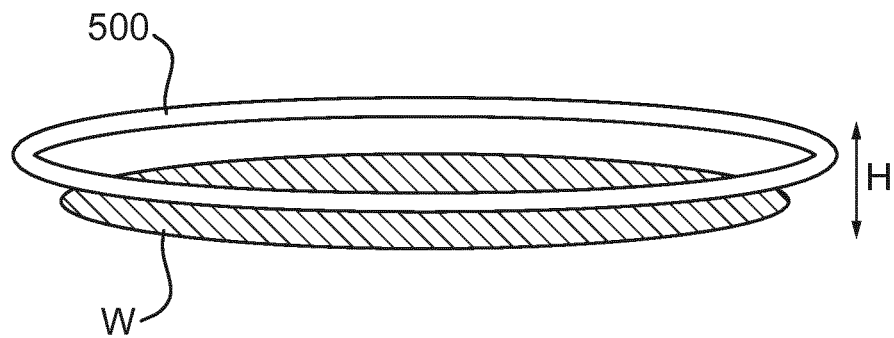
FIG. 5 illustrates schematically and in perspective an etch parameter which may be varied according to the present invention.

FIG. 5 illustrates schematically one etch parameter which might be varied for example to change the direction of the electric field at the edge of the substrate W to change the etching direction (see FIG. 3). Illustrated in FIG. 5 is a substrate W and an electrode 500. The electrode 500 is in the form of a ring. The electrode 500 surrounds the edge of the substrate W. An electrical bias may be applied to the electrode 500.

One etch parameter which might be varied in the arrangement of FIG. 5 is the distance H of the electrode 500 away from the substrate W in a direction perpendicular to the plane of the top surface of the substrate W. As the electrode 500 wears during use, the optimum distance H will vary. Another or alternative etch parameter which can be varied is the electrical bias applied to the electrode 500.

In one embodiment a predetermined relationship between the difference between the first and second measurements described above and the etch parameter may be used when changing the etch parameter. One way of establishing this predetermined relationship is described below. Indeed a way of using the established relationship in order to change the etch parameter, for example after wear of the electrode 500, is described.

Figure 6:
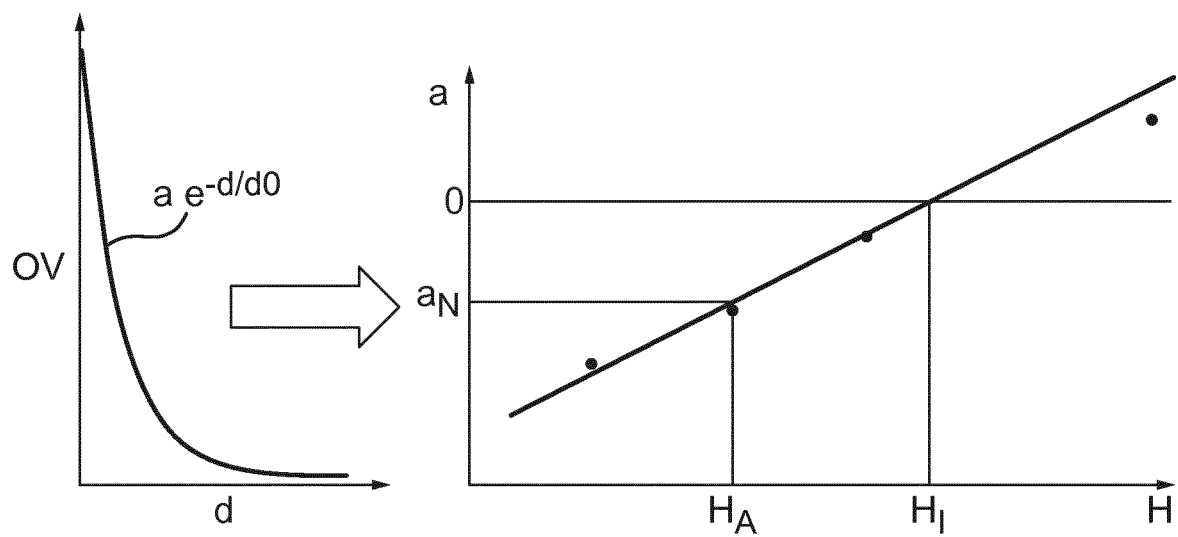
FIG. 6 illustrates on the left hand side a model of overlay error on the y axis as a function of distance from a substrate edge along the x axis, and on the right hand side a relationship between a variable associated with the model on the y axis changing with etch parameter plotted on the x axis.

The inventors have determined that it is possible to model the overlay error introduced by non optimal selection of a distance H. FIG. 6 shows on the left hand side a model for the overlay error OV on the y axis as a function of distance d from the edge of a substrate W. That is, overlay error OV resulting from the etch process is measured, for example in accordance with the method described above with reference to FIG. 4, and the measured overlay errors OV are plotted on a graph as a function of distance d from the edge of the substrate W. A function may be fitted to this data plotted on a graph of distance d from the edge on the x axis and overlay error OV on the y axis. The function may have the form of 1-over-e distance (d0) and with an amplitude a. The inventors have found that the 1-over-e distance does not vary as a function of distance H whereas the amplitude a varies linearly with H. This is illustrated by the experimental results in the right hand graph of FIG. 6.

Other models may be used for modelling the measured overlay error OV resulting from the etch process. For example, a hyperbolical edge model or a cubic B-spline model may be used. The function is an exponential decay. In an embodiment the function is fitted to the data by varying a first variable. In this way the first variable is indicative of an etch induced effect (e.g. the first variable characterizes a fingerprint of an etch induced effect). In an embodiment the first variable is an amplitude a which is indicative of the magnitude of a metric (e.g. overlay error OV induced by the etching process) of a structure on the substrate W.

Using the information in the figure from the right hand side of FIG. 6 an initial value of the etch parameter (the distance $H_I$) can be determined to achieve a desired value of the first variable (the amplitude a). In the case of the model of FIG. 6 an amplitude of zero is desired as this indicates zero overlay.

In order to determine the relationship a plurality of test samples undergo first measurement prior to etching, second measurement after etching with different values of distance H. For each of those samples the results of the difference between the first and second measurements can be plotted on a graph to show etch induced overlay OV error as a function of distance d from the edge of the substrate W (the same as that on the left hand side of FIG. 6). The model can be fitted to those experimental results to determine the first variable (the amplitude (a)) for each substrate (and so for various values of etch parameter, namely distance H). The results of each of the measurements at different values of distance H can then be plotted on a graph in accordance with the right hand side of FIG. 6.

After several etching processes have been completed, it is expected that the electrode 500 will have worn. Such wear is expected to result in the incorporation of overlay errors due to the changed etching process. Unexpectedly the inventors have found that it is possible to use the results of the predetermined relationship between etch induced overlay error OV and the non-worn electrode 500, to correct for the etch induced overlay error resulting from the wear of the electrode 500. The way this is done is by establishing a trend in a variation of the first variable (amplitude a) (which is of course associated with the amount of etch induced overlay error) with the variation in the etch parameter (distance H). In an embodiment the trend may be the slope of the line in the right hand graph of FIG. 6. If an amplitude of etch induced overlay error $a_N$ is measured, it is assumed that increasing the distance H by a value of $H_I$ (the initial value of the H parameter) minus the distance $H_A$ (which is the distance H which would have resulted in the newly measured amplitude $a_N$ with an unworn electrode 500). That is, the distance H is increased by $H_I$–$H_A$. Thus the overlay error induced due to wear of the electrode hoop 500 is reduced. Thus the etch parameter for the substrate etching process for subsequent substrates is changed by an amount predicted by the trend (slope in this case) to result in a variation of the actual first variable (amplitude a) to the desired value of the first variable (zero in the case of overlay amplitude). This process can be followed, for example, when an (etch induced) overlay error above a predetermined maximum is measured. When the process is repeated, it is assumed that the relationship of FIG. 6 (i.e. the trend or slope) is maintained despite the electrode 500 having been worn.

FIG. 7 illustrates the success achievable with this approach. The left hand side of FIG. 7 illustrates the overlay measurements made before applying the correction to the distance H with a worn electrode 500 which was initially operating with a low measured overlay before getting worn. The left hand plot illustrates, in plan, the difference between the first measurement and second measurement (i.e. is a similar plot to the right hand side of FIG. 4) and the left hand graph of FIG. 7 is a graph with the plotted overlay measurements as a function of distance d from the edge of the substrate W (i.e the same as the graph on the left hand side of FIG. 6, also including the fitted function). By calculating the first variable (amplitude a) and changing the actual parameter for the substrate etching process for the next substrate by an amount predicted by the relationship to result in a variation of the actual first variable to be zero, the results on the right hand side of FIG. 7 where achieved. As can be seen from the both of the plan view and graph on the right hand side of FIG. 7, the overlay error is much reduced compared to before the parameter was changed on the basis of the relationship which had been previously established.

Thus the inventors have found a way of compensating for etch induced overlay error over time.

In order to fit the function to the overlay data, it has been found that good results can be achieved efficiently if more measurements are taken at a distance close to the edge of the substrates than are taken away from the edge of the substrate. FIG. 4 illustrates a typical measurement layout and distribution which may be used in the present invention.

Although the method of establishing a relationship and using that relationship to change the etch parameter has been described in connection with the etch parameter being the distance H of an electrode 500 from a substrate W, the same method may be used for other etch parameters including, but not limited to the voltage bias applied to the electrode 500, a thermal pattern across the substrate W, a chemical concentration pattern in plasma used in the etching process etc.

As described above, the relationship can be established using a method of determining an etch induced overlay error comprising making first and second measurements pre and post etching respectively and calculating the difference between the first and second measurements (as described above with reference to FIG. 4). However the variable may be a variable indicative of a different etch induced error, for example an error in the placement of an edge of a feature of one layer of the substrate relative to an edge of a feature of another layer of the substrate, a difference between a desired dimension of a feature and a measured dimension of a feature (e.g. critical dimension), asymmetry in a property measured at one or more locations on the substrate, and a deviation from a desired shape for errors induced by etching a first layer of a structure, measurements only after etching are made, for example of critical dimension and/or of asymmetry.

In the embodiment of FIG. 6 the relationship is assumed to be linear. However the invention is not limited to this and the variation of the first variable associated with etching a structure on the substrate with a variation in the etch parameter may be modelled as any other function.

In an embodiment the etch parameter is only changed if the measured actual first variable is different from the desired value of the first variable by more than a predetermined maximum.

Although described above as if the etching used to determine the relationship is performed in the same etching chamber as the subsequent etching using the initial value $H_I$ of etch parameter (distance H) and as the etching after changing the etch parameter based on the relationship, this is not necessarily the case. For instance, the relationship can be determined in a given etching chamber and applied in other etching chambers. The relationship (i.e. trend or slope) will hold in other etching chambers, but the amplitude for a given etch parameter may not. This means that it may not be possible accurately to select an initial value of the etch parameter using the relationship to achieve the desired etch parameter. However the relationship can be used to adjust the etch parameter to result in a desired value of the first variable.

It will be appreciated, that the etching process can be used to compensate for effects introduced by the lithographic apparatus during imaging of the substrate W. In this case the goal may not be to reduce the etch effect as much as possible, but to achieve a desired etching process which results in at least a partial correction of the effects introduced by the lithographic apparatus during imaging. Thus the method does not necessarily compensate for etch induced errors and reduce them as low as possible, but it may be used to reduce errors in the substrate W resulting from both the imaging and etching steps.

Further embodiments of the invention are disclosed in the list of numbered embodiments below:

1. A method to change an etch parameter of a substrate etching process, the method comprising:
   making a first measurement of a first metric associated with a structure on a substrate before being etched;
   making a second measurement of a second metric associated with a structure on a substrate after being etched; and
   changing the etch parameter based on a difference between the first measurement and the second measurement.
2. The method of embodiment 1, wherein the first metric and second metric are a metric indicative of one or more of: an overlay error between two or more layers on the substrate, an error in the placement of an edge of a feature of one layer of the substrate relative to an edge of a feature of another layer of the substrate, a difference between a desired dimension of a feature and a measured dimension of the feature, asymmetry in a property measured at onre or more locations on the substrate.
3. The method of embodiment 1 or 2, wherein the first measurement and second measurement are predominantly made around an edge portion of the substrate, preferably wherein the first measurement and second measurement are exclusively made around an edge portion of the substrate.
4. The method of embodiment 1, 2 or 3, wherein the etch parameter is one or more of: a thermal pattern across the substrate, a chemical concentration pattern in plasma used in the etching process, an electric field pattern surrounding a substrate during the etching process, a voltage applied to one or more electrodes during the etching process.
5. The method of any of embodiments 1-4, wherein the first measurement and second measurement are non-destructive.
6. The method of any of embodiments 1-5, wherein the first measurement and second measurement are made on the same substrate.
7. The method of any of embodiments 1-6, wherein the first measurement and second measurement are made on different structures.
8. The method of any of embodiments 1-7, wherein the first measurement comprises a first plurality of measurements across the substrate and the second measurement comprises a second plurality of measurements across the substrate.
9. The method of embodiment 8, further comprising fitting a function to the first plurality of measurement and/or fitting a function to the second plurality of measurements.
10. The method of embodiment 8 or 9, further comprising transposing the first plurality of measurements to a common grid and transposing the second plurality of measurements to the common grid.
11. The method of any of embodiments 1-10, wherein the first and second measurements comprise measuring first and/or higher order diffraction patterns of incident radiation.
12. The method of embodiment 11, wherein a wavelength of the incident radiation is varied during the first measurement and/or second measurement and the first metric and/or second metric is determined based on differences in the first and/or higher order diffraction patterns at different wavelengths and/or polarisations of incident radiation.
13. The method of any of embodiments 1-10, wherein the first and second measurements comprise dimensional and/or geometrical measurements of a cross-section of the respective substrate.
14. The method of any of embodiments 1-13, wherein the etch parameter is changed if the difference is greater than a predetermined minimum difference.
15. The method of any of embodiments 1-14, wherein the first metric and/or second metric is a statistic relating to a plurality of individual measurements.
16. The method of any of embodiments 1-15, wherein the etch parameter is kept unchanged if the difference is less than a predetermined maximum difference, preferably the etch parameter is kept unchanged if there is no difference between the first measurement and the second measurement.
17. The method of any of embodiments 1-16, wherein the changing occurs on the basis of a predetermined relationship between the difference and the etch parameter.
18. The method of embodiment 17, wherein the predetermined relationship is experimentally determined.
19. The method of etching a lot of substrates using a substrate etching process, comprising: performing the method of any of embodiments 1-18 using a first substrate of the lot of substrates thereby to change the etch parameter; and etching remaining substrates of the lot of substrates using the changed etch parameter.
20. The method of etching a lot of substrates using a substrate etching process of embodiment 19, further comprising performing the method of any of embodiments 1-18 a second time after an interval.
21. The method of embodiment 20, wherein the interval is one of the group comprising:
a pre-determined time;
a pre-determined number of substrates being etched;
a time period determined by a measurement;
a time period dependent upon the difference.
22. The method of any of embodiments 1-21, further comprising performing a further step on the substrate on which the second measurement is made if the difference between the first measurement and second measurement results in changing the etch parameter.
23. The method of embodiment 22, wherein the further step is a step of reshaping the structure.
24. A computer program product comprising machine-readable instructions for causing one or more processors to control a measurement system to make the first and second measurements and change the etch parameter of a substrate etching process in accordance with any of embodiments 1-23.
25. A method of controlling an etch parameter of a substrate etching process, the method comprising:
providing a relationship between a first variable indicative of an etch induced effect and the etch parameter;
determining an initial value of the etch parameter;
performing the substrate etching process on a first set of substrates using the initial value of the etch parameter; and
determining the actual first variable on a substrate of the first set of substrates and changing the etch parameter for the substrate etching process for subsequent substrates by an amount predicted by the relationship to result in a desired substrate etching process.
26. The method of embodiment 25, wherein the etch parameter is one selected from the group including: the position of an electrode which surrounds an edge of the subject relative to the substrate during the substrate etching process;
a voltage bias applied to an electrode which surrounds an edge of the substrate during the substrate etching process.
27. The method of embodiment 25 or 26, wherein providing a relationship includes measuring a first metric associated with a structure on a substrate for a plurality of substrates before being etched, measuring a second metric associated with the structure on the substrate for each of the plurality of substrates after they have been etched by the substrate etching process using different values of the etch parameter, and fitting a function to a difference between the first measurement and second measurement of each substrate, wherein the function includes the first variable as a variable.
28. The method of embodiment 27, wherein each first measurement and second measurement involves multiple individual measurements and a radial distance from the edge of the substrate to the position of measurement is a variable in the function.
29. The method of embodiment 27 or 28, wherein the measurements are predominantly made around an edge portion of the substrate, preferably wherein the number of measurements increases with increasing distance from the centre of the substrate.
30. The method of embodiment 27, 28 or 29, wherein the function has the form of the first variable multiplied by 1 over e radial distance d from the edge of the substrate to the position of measurement.
31. The method of embodiment 27, 28, 29 or 30, wherein the first metric is a metric indicative of one or more of: an overlay error between two or more layers on the substrate, an error in the placement of an edge of a feature of one layer of the substrate relative to an edge of a feature of another layer of the substrate, a difference between a desired dimension of a feature and a measured dimension of the feature, asymmetry in a property measured at multiple locations on the substrate, a deviation from a desired shape.
32. The method of any of embodiments 27 to 31, wherein the etching by the substrate etching process of the providing step takes place in an etching chamber different to an etching chamber in which the etching process of the performing takes place.
33. The method of any of embodiments 25 to 32, wherein the relationship is assumed to be linear.
34. A method of changing an etch parameter of a substrate etching process, the method comprising: making a measurement of an etched structure on a substrate; and changing the etch parameter based on an asymmetry in a result of the measurement.
35. The method of embodiment 34, wherein the measurement is based on scatterometry.

CONCLUSION

The different steps described above may be implemented by respective software modules running on one or more processors within the patterning system. These processors may be part of the existing lithographic apparatus control unit, or additional processors added for the purpose. On the other hand, the functions of the steps may be combined in a single module or program, if desired, or they may be subdivided or combined in different sub-steps or sub-modules.

An embodiment of the invention may be implemented using a computer program containing one or more sequences of machine-readable instructions describing methods of recognizing characteristics in position data obtained by alignment sensors, and applying corrections as described above. This computer program may be executed for example within the control unit LACU 206 of FIG. 2, or some other controller. There may also be provided a data storage medium (e.g., semiconductor memory, magnetic or optical disk) having such a computer program stored therein.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The invention claimed is:
1. A method to change an etch parameter of a substrate etching process, the method comprising:
obtaining a first measurement of a first metric associated with a structure, separate from a product pattern, both the structure and the product pattern on a substrate and the first measurement is obtained before the structure is etched;

obtaining a second measurement of a second metric associated with a structure, separate from the product pattern, both the structure and the product pattern on a substrate and the second measurement is obtained after the structure is etched; and changing the etch parameter based on a difference between the first measurement and the second measurement, wherein the first metric and second metric are a metric indicative of one or more selected from: an overlay error between two or more layers on the substrate, an error in the placement of an edge of a feature of one layer of the substrate relative to an edge of a feature of another layer of the substrate, and/or asymmetry in a property of a feature measured at one or more locations on the substrate.

2. The method of claim 1, wherein the first measurement and second measurement are predominantly made around an edge portion of the substrate.

3. The method of claim 1, wherein the etch parameter is one or more selected from: a thermal pattern across the substrate, a chemical concentration pattern in plasma used in the etching process, an electric field pattern surrounding a substrate during the etching process, and/or a voltage applied to one or more electrodes during the etching process.

4. The method of claim 1, wherein the first measurement comprises a first plurality of measurements across the substrate and the second measurement comprises a second plurality of measurements across the substrate.

5. The method of claim 1, wherein the first and second measurements comprise measuring first and/or higher order diffraction patterns of incident radiation.

6. The method of claim 5, wherein a wavelength of the incident radiation is varied during the first measurement and/or second measurement and the first metric and/or second metric is determined based on differences in the first and/or higher order diffraction patterns at different wavelengths and/or polarizations of incident radiation.

7. The method of claim 1, wherein the first and second measurements comprise dimensional and/or geometrical measurements of a cross-section of the respective substrate.

8. The method of claim 1, wherein the first metric and/or second metric is a statistic relating to a plurality of individual measurements.

9. The method of claim 1, wherein the etch parameter is kept unchanged if the difference is less than a predetermined maximum difference.

10. The method of claim 4, further comprising fitting a function to the first plurality of measurements and/or fitting a function to the second plurality of measurements.

11. The method of claim 10, further comprising transposing the first plurality of measurements to a common grid and transposing the second plurality of measurements to the common grid.

12. A non-transitory computer-readable medium having machine-readable instructions therein, the instructions configured, upon execution by a computer system, to cause the computer system to at least:

obtain a first measurement of a first metric associated with a structure, separate from a product pattern, both the structure and the product pattern on a substrate and the first measurement is obtained before the structure is etched;

obtain a second measurement of a second metric associated with a structure, separate from the product pattern, both the structure and the product pattern on a substrate and the second measurement is obtained after the structure is etched; and change the etch parameter based on a difference between the first measurement and the second measurement, wherein the first metric and second metric are a metric indicative of one or more selected from: an overlay error between two or more layers on the substrate, an error in the placement of an edge of a feature of one layer of the substrate relative to an edge of a feature of another layer of the substrate, and/or asymmetry in a property of a feature measured at one or more locations on the substrate.

13. The computer-readable medium of claim 12, wherein the instructions configured to cause the computer system to change the etch parameter are further configured to cause the computer system to change the etch parameter using a function of the etch parameter and a variable, the variable being of a function of values of the first and/or second metric and a location on a substrate of the values of the first and/or second metrics.

14. The computer-readable medium of claim 12, wherein the first and second measurements comprise measuring first and/or higher order diffraction patterns of incident radiation.

15. The computer-readable medium of claim 14, wherein a wavelength of the incident radiation is varied during the first measurement and/or second measurement and the first metric and/or second metric is determined based on differences in the first and/or higher order diffraction patterns at different wavelengths and/or polarizations of incident radiation.

16. The computer-readable medium of claim 12, wherein the first metric and/or second metric is a statistic relating to a plurality of individual measurements.

17. A non-transitory computer-readable medium having machine-readable instructions therein, the instructions configured, upon execution by a computer system, to cause the computer system to at least:

obtain a first measurement of a first metric associated with a structure, separate from a product pattern, both the structure and the product pattern on a substrate and the first measurement is obtained before the structure is etched by a substrate etching process;

obtain a second measurement of a second metric associated with a structure, separate from the product pattern, both the structure and the product pattern on a substrate and the second measurement is obtained after the structure is etched by the substrate etching process; and change an etch parameter of the substrate etching process using a function of the etch parameter and a variable, the variable being of a function of values of the first and/or second metric and a location on a substrate of the values of the first and/or second metrics.

18. The computer-readable medium of claim 17, wherein the first and second measurements comprise measuring first and/or higher order diffraction patterns of incident radiation.

19. The computer-readable medium of claim 18, wherein a wavelength of the incident radiation is varied during the first measurement and/or second measurement and the first metric and/or second metric is determined based on differences in the first and/or higher order diffraction patterns at different wavelengths and/or polarizations of incident radiation.

20. The computer-readable medium of claim 17, wherein the first metric and/or second metric is a statistic relating to a plurality of individual measurements.

* * * * *